United States Patent
Waite et al.

(10) Patent No.: US 7,422,956 B2
(45) Date of Patent: Sep. 9, 2008

(54) SEMICONDUCTOR DEVICE AND METHOD OF MAKING SEMICONDUCTOR DEVICE COMPRISING MULTIPLE STACKED HYBRID ORIENTATION LAYERS

(75) Inventors: Andrew Michael Waite, Wappingers Falls, NY (US); Jon D. Cheek, Cedar Park, TX (US)

(73) Assignee: Advanced Micro Devices, Inc., Syunnyvale, CA (US)

( * ) Notice: Subject to any disclaimer, the term of this patent is extended or adjusted under 35 U.S.C. 154(b) by 282 days.

(21) Appl. No.: 11/006,747

(22) Filed: Dec. 8, 2004

(65) Prior Publication Data
US 2006/0118918 A1  Jun. 8, 2006

(51) Int. Cl.
  *H01L 21/76* (2006.01)
(52) U.S. Cl. .................. 438/406; 438/407; 438/409; 438/455
(58) Field of Classification Search .................. 438/406, 438/407, 409, 455–459; 257/E21.568; 148/DIG. 12
See application file for complete search history.

(56) References Cited

U.S. PATENT DOCUMENTS 5,307,433 A   4/1994   Stein (Continued)

FOREIGN PATENT DOCUMENTS

FR        2819099        7/2002

OTHER PUBLICATIONS

Drawings obtained from http://www.ee.byu.edu/cleanroom/EW_orientation.phtml on Sep. 19, 2007.*

(Continued)

*Primary Examiner*—George Fourson
*Assistant Examiner*—John M Parker
(74) *Attorney, Agent, or Firm*—McDermott Will & Emery LLP (57) ABSTRACT

A semiconductor device comprising a substrate having a first crystal orientation is provided. A first insulating layer overlies the substrate and a plurality of silicon layers overlie the first insulating layer. A first silicon layer comprises silicon having a second crystal orientation and a crystal plane. A second silicon layer comprises silicon having the second crystal orientation and a crystal plane that is substantially orthogonal to the crystal plane of the first silicon layer. Because holes have higher mobility in the (110) plane than the (100) plane, while electrons have higher mobility in (100) plane than the (110) plane, semiconductor device performance can be enhanced by the selection of silicon layers with certain crystal plane orientations. In addition, a method of forming a semiconductor device is provided. A silicon-on-insulator structure comprising a first silicon substrate having a first crystal orientation with a first insulating layer formed thereon and a first silicon layer having a second crystal orientation and a crystal plane overlying the first insulating layer is bonded to a second silicon substrate. The second silicon substrate has the second crystal orientation and a crystal plane and a second insulating layer formed thereon. The second silicon substrate comprises a line of defects created by implanting hydrogen ion into the second silicon substrate. The crystal plane of the second silicon substrate is oriented substantially orthogonal to the crystal plane of the first silicon layer. The second silicon substrate is split and removed along the line of defects leaving behind the second insulating layer and a second silicon layer on the silicon-on-insulator structure. A plurality of devices with different crystal orientations can be subsequently formed on a single, planar silicon-on-insulator structure by selectively etching the silicon-on-insulator structure down to silicon layers of different crystal orientations, growing selective epitaxial silicon layers in the etched regions, and subsequently planarizing the silicon-on-insulator structure by chemical-mechanical polishing.

12 Claims, 10 Drawing Sheets

U.S. PATENT DOCUMENTS

| | | | |
|---|---|---|---|
| 5,439,843 A | 8/1995 | Sakaguchi et al. | |
| 7,102,166 B1* | 9/2006 | Bryant et al. | 257/64 |
| 7,153,753 B2* | 12/2006 | Forbes | 438/404 |
| 2003/0094674 A1* | 5/2003 | Ipposhi et al. | 257/627 |
| 2004/0075143 A1* | 4/2004 | Bae et al. | 257/347 |
| 2004/0087109 A1* | 5/2004 | McCann et al. | 438/455 |
| 2004/0175901 A1* | 9/2004 | Hadji et al. | 438/458 |
| 2005/0009252 A1* | 1/2005 | Yamazaki et al. | 438/151 |
| 2005/0116290 A1* | 6/2005 | de Souza et al. | 257/347 |
| 2005/0145940 A1* | 7/2005 | Maeda et al. | 257/347 |
| 2005/0151201 A1* | 7/2005 | Fukunaga | 257/368 |
| 2006/0281280 A1* | 12/2006 | Endo et al. | 438/455 |
| 2007/0054459 A1* | 3/2007 | Aga et al. | 438/311 |
| 2007/0066035 A1* | 3/2007 | Droes et al. | 438/473 |

OTHER PUBLICATIONS

Notification of Transmittal of the International Preliminary Report on Patentability dated Mar. 21, 2007 issued in PCT/US2005/043398.

* cited by examiner

SEMICONDUCTOR DEVICE AND METHOD OF MAKING SEMICONDUCTOR DEVICE COMPRISING MULTIPLE STACKED HYBRID ORIENTATION LAYERS

FIELD OF THE INVENTION

The present invention relates to semiconductor devices and methods of manufacturing semiconductor devices and, more particularly, to an improved semiconductor device comprising silicon-on-insulator (SOI) technology.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFETs) are particularly well suited for use in high-density integrated circuits. As the size of MOSFETs and other devices decrease, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a depth on the order of 1000 Å or less, are generally required for acceptable performance in short channel devices.

Silicon-on-insulator (SOI) technology allows the formation of high-speed, shallow-junction devices. In addition, SOI devices improve performance by reducing parasitic junction capacitance.

In a SOI substrate, a buried oxide (BOX) film made of silicon oxide is formed on single crystal silicon, and a single crystal silicon thin film is formed thereon. Various methods for fabricating such SOI substrates are known. One such method is Separation-by-Implanted Oxygen (SIMOX), wherein oxygen is ion implanted into a single crystal silicon substrate to form a buried oxide (BOX) film.

Another method of forming a SOI substrate is wafer bonding, wherein two semiconductor substrates with silicon oxide surface layers are bonded together at the silicon oxide surfaces to form a BOX layer between the two semiconductor substrates.

Another SOI technique is Smart Cut®, which also involves bonding semiconductor substrates through oxide layers. In the Smart Cut® method, one of the semiconductor substrates is implanted with hydrogen ions prior to bonding. The hydrogen ion implants subsequently allows the hydrogen ion implanted substrate to be split from the bonded substrates leaving behind a thin layer of silicon on the surface.

Semiconductor device performance can be further enhanced by the selection of silicon layers with certain crystal plane orientations, which facilitate hole or electron flow. For example, the performance of P-type MOSFETs (PMOSFETs) can be improved if they are fabricated on a (110) silicon surface, with the gates oriented so that the holes flow in the (110)/<110> direction. The mobility of holes flowing in the (110)/<110> direction is more than twice as high as that of holes flowing in the conventional (100)/<110> direction. Unfortunately, on the (110) surface holes traveling at right angles to the (110)/<110> direction flow in the (110)/<100> direction. Hole mobility in the (110)/<100> direction is only two-thirds that of holes flowing in the (110)/<110> direction. In addition, electron mobility in the (110) plane is much lower than that in the conventional (100) plane.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a device that combines the performance improvements of SOI technology and optimal silicon crystal orientation. There further exists a need in this art for semiconductor devices comprising MOSFETs, wherein the PMOSFETs and NMOSFETs are fabricated on the optimum silicon surfaces for hole and electron mobility, respectively. There also exists a need in this art for methodology for forming a semiconductor device comprising SOI technology and optimal silicon crystal orientation. In addition, there exists a need in this art for methodology of forming semiconductor devices comprising MOSFETs, wherein the PMOSFETs and NMOSFETs are fabricated on the optimum silicon surfaces for hole and electron mobility.

These and other needs are met by embodiments of the present invention, which provide a semiconductor device comprising a substrate having a first crystal orientation. A first insulating layer overlies the substrate and a plurality of silicon layers overlie the first insulating layer. A first silicon layer comprises silicon having a second crystal orientation and a crystal plane. A second silicon layer comprises silicon having the second crystal orientation and a crystal plane that is substantially orthogonal to the crystal plane of the first silicon layer.

These and other needs are further met by embodiments of the present invention, which provide a method of forming a semiconductor device comprising providing a silicon-on-insulator structure comprising a first silicon substrate having a first crystal orientation with a first insulating layer formed thereon and a first silicon layer having a second crystal orientation and a crystal plane overlying the first insulating layer. A second silicon substrate is provided having the second crystal orientation and a crystal plane and a second insulating layer formed on the second substrate. The second silicon substrate comprises a line of defects created by implanting hydrogen ions into the second silicon substrate. The second silicon substrate is bonded to the silicon-on-insulator structure through the second insulating layer and the first silicon layer, such that the crystal plane of the second silicon substrate is oriented substantially orthogonal to the crystal plane of the first silicon layer. The second silicon substrate is split and removed along the line of defects leaving behind the second insulating layer and second silicon layer on the silicon-on-insulator structure.

This invention addresses the needs for an improved high-speed semiconductor device with improved electrical characteristics.

The foregoing and other features, aspects, and advantages of the present invention will become apparent in the following detailed description of the present invention when taken in conjunction with the accompanying drawings.

DETAILED DESCRIPTION OF THE INVENTION

The present invention enables the production of improved high-speed semiconductor devices with the benefits of SOI technology and MOSFETs formed on silicon layers having different crystal orientations on a common substrate. The present invention further provides the higher hole mobility offered by PMOSFETs formed over silicon layers having a (110)/<110> crystal orientation with the reduced parasitic junction capacitance benefits of SOI technology.

In order to optimize the full performance gain from fabricating devices on the (110) plane, all of the PMOSFET gates have to be oriented so that holes can flow in the (110)/<110> direction. In conventional circuit layouts MOSFET gate electrodes are fabricated so that many gates are at right angles to other gates.

According to certain embodiments of the present invention, the multiple stacked hybrid orientation layers provide a plurality of silicon layers having (110) planes oriented substantially orthogonal to each other formed on a common SOI structure. Thus, a plurality of PMOSFETs can be fabricated with gates that are substantially orthogonal to each other. By proper selection of the silicon layer crystal orientation holes in all the PMOSFETs can flow in the high mobility (110)/<110> direction.

The invention will be described in conjunction with the formation of the semiconductor devices illustrated in the accompanying drawings. However, this is exemplary only as the claimed invention is not limited to the formation of the specific devices illustrated in the drawings.

Figure 1:
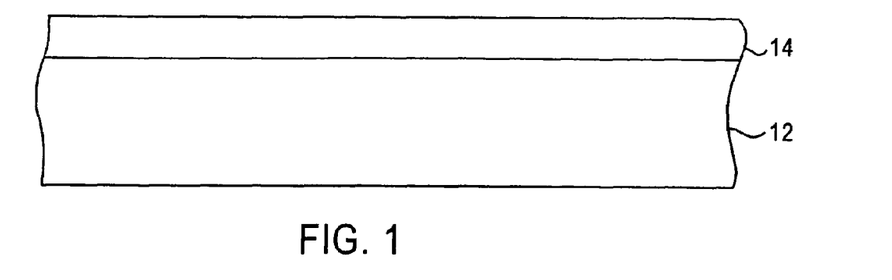
FIGS. 1-18 illustrate the formation of a SOI semiconductor device with MOSFETs formed on silicon layers of different crystal orientations on a common substrate.
Figure 2:
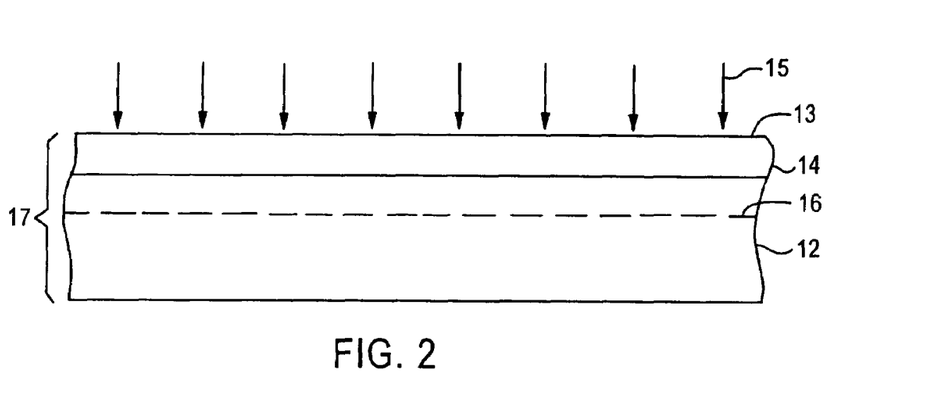

A method of forming a semiconductor device on a SOI substrate using a Smart Cut® technique will be described. However, alternative techniques of forming SOI structures, such as SIMOX, can be used according to alternate embodiments of the present invention. An upper section 17 is formed by providing a monocrystalline silicon substrate 12, such as silicon wafer 12, as shown in FIG. 1. The silicon wafer 12 comprises silicon having a crystal orientation and a crystal plane. In certain embodiments of the present invention, the silicon wafer 12 has a <110> crystal orientation and (110) plane. An insulating layer 14 is formed over the silicon wafer 12. In certain embodiments of the present invention, the insulating layer 14 is a silicon oxide layer. The silicon oxide layer 14 can be formed by conventional methods, such as thermal oxidation of the silicon wafer 12, according to certain embodiments of the present invention. As shown in FIG. 2, hydrogen ions 15 are implanted in the silicon wafer 12 to a predetermined depth 16 to form the upper section 17. The implanted hydrogen ions create microcavities, microblisters or microbubbles in the implanted wafer. When the density and size of the microcavities reduce the cavity distance below a certain threshold, intercavity fractures occur and propagate though a percolation type process. This ultimately leads to a splitting of the wafer 12, as discussed below.

A lower section 23 comprising a silicon substrate 18, such as a silicon wafer 18, is provided to be bonded to the upper section 17. The lower section silicon wafer 18 has a crystal plane that is different from the crystal plane of the upper section silicon wafer 12. In certain embodiments of the present invention, the lower section silicon wafer 18 has a (100) crystal plane.

Figure 3:
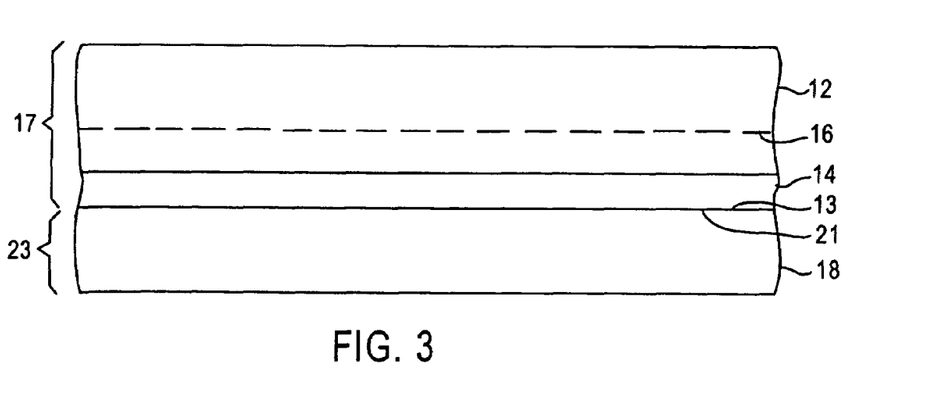

As shown in FIG. 3, the upper section 17 and the lower section 23 are bonded to each other through the insulating layer surface 13 and the surface layer 21 of the lower section 23. In certain embodiments, the bonding surfaces 13, 21 of the upper section 17 and the lower section 23 are polished to a low surface roughness, e.g., 2 Å μm$^2$ RMS. The lower section 23 and the upper section 17 are pressed together and heated in an inert atmosphere at a temperature in the range of from about 900° C. to about 1200° C. for about 5 minutes to about 5 hours to fuse the lower section 23 and the upper section 17.

In certain embodiments of the present invention, an oxidizer, such as a drop of an aqueous solution of $H_2O_2$ or $HNO_3$ and H2O$_2$ is provided in the interface between the upper section 17 and the lower section 19. The oxidizer improves the bonding process by allowing relatively lower temperature bonding, providing better stress compensation by providing dopants in the bonding liquid which will produce a bonding layer which has closely matched coefficients of thermal expansion to that of a substrate wafers, and limiting contaminant migration by the use of dopants in the bonding liquid that will provide a bonding layer that is a barrier to diffusion of mobile contaminants.

Figure 4:
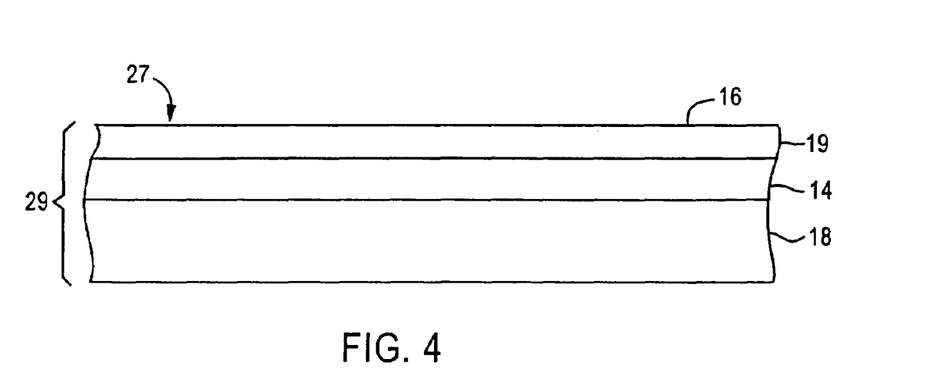

The combined upper and lower sections 17, 23 is subsequently annealed at about 1100° C. for about 2 hours. This annealing step causes the microcavities in the hydrogen doped upper section 17 to propagate causing the wafer 12 to split along the line of defects 16. The bulk silicon portion of the upper section substrate 12 is then removed leaving behind an adhered silicon layer 19. Thus, a SOI structure 27 is obtained, as shown in FIG. 4. In certain embodiments of the present invention, after the formation of the SOI structure 27, the structure 27 is polished because the split silicon layer 19 exhibits microroughness.

Figure 5:
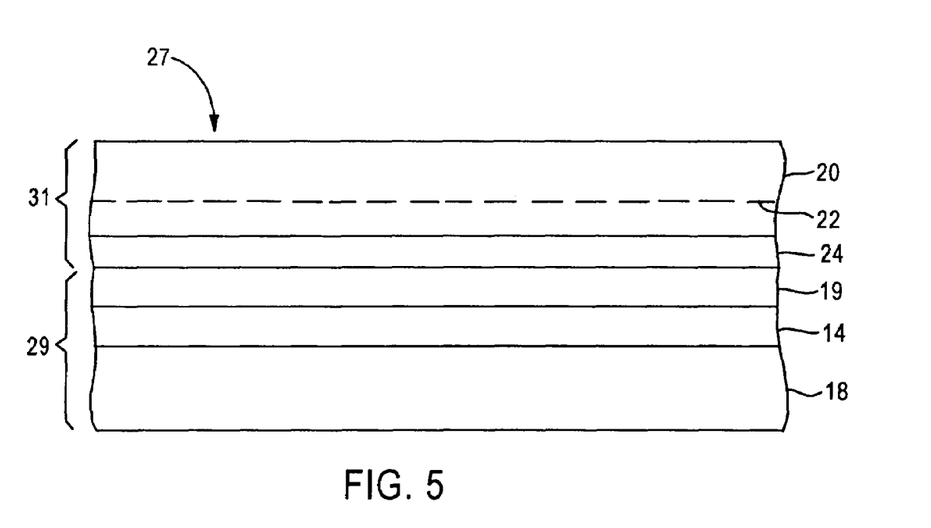

An additional SOI silicon layer 25 is formed on the 501 structure 27 to form a semiconductor device comprising multiple stacked hybrid orientation layers. This can be accomplished by repeating the Smart Cut® process, as previously described. The SOI structure 27, as shown in FIG. 4, becomes the lower section 29 for the formation of an additional SOI silicon layer 25. As shown in FIG. 5, an upper section 31 comprising an insulating layer 24, such as a silicon oxide layer 24, and a silicon substrate 20 is bonded to the lower section 29. As previously described, the defect line 22 is formed by implanting hydrogen ions into the silicon substrate 20. The silicon substrate 20 of the upper section 31 comprises silicon having the same crystal plane as silicon layer 19. However, the upper section 31 is positioned on the lower section 29, such that the silicon plane of the silicon substrate 20 is oriented substantially orthogonal to the silicon plane of silicon layer 19. In certain embodiments of the present invention, the silicon layer 19 of the lower section 29 and the silicon substrate 20 of the upper section 31 both comprise monocrystalline silicon having a (110) crystal plane. In certain other embodiments of the present invention, silicon having other crystal orientations can be used.

Figure 6:
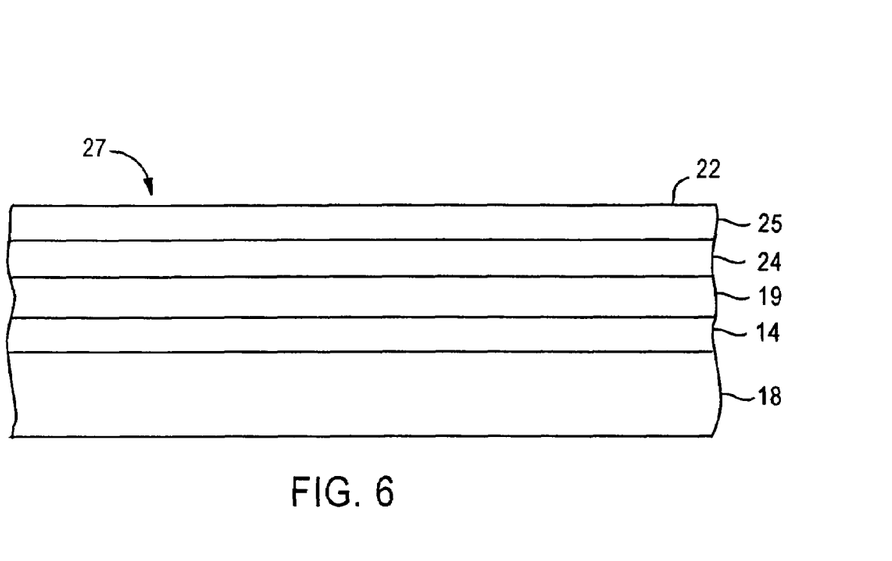

The upper section 31 and lower section 19 are subsequently bonded, the upper wafer 20 is split and removed along a line of defects 22, as previously described resulting in a SOI structure 27 comprising a substrate 18 having a first crystal plane, a first insulating layer 14 overlying the substrate 18, a first silicon layer 19 comprising silicon having a crystal orientation and a second crystal plane, a second insulating layer 24, and a second silicon layer 25 comprising silicon having the second crystal plane and a crystal orientation that is substantially orthogonal to the crystal orientation of the first silicon layer 19, as shown in FIG. 6. In certain embodiments of the present invention, the first and second silicon layers 19, 25 are formed to a thickness of about 30 nm to about 100 nm.

Figure 7:
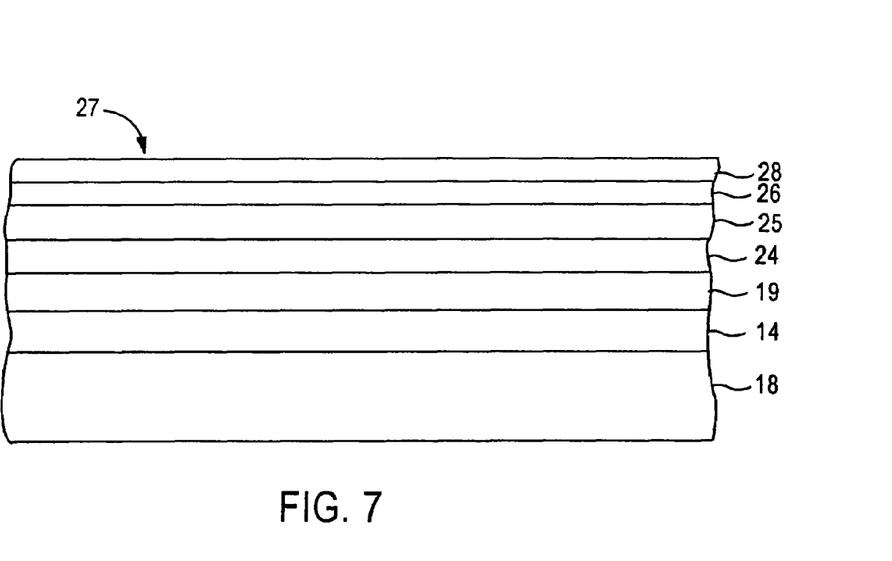

As illustrated in FIG. 7, a silicon oxide layer 26 is formed over the second silicon layer 25. The silicon oxide layer 26 can be deposited, such as by chemical vapor deposition (CVD), or the top surface of the silicon layer 25 can be thermally oxidized. A silicon nitride film 28 is subsequently deposited over the silicon oxide layer 26. The thickness of the silicon oxide layer 26, in certain embodiments of the present invention, ranges from about 5 nm to about 100 nm. In certain embodiments of the present invention, the silicon oxide layer 26 is about 20 nm thick. The silicon nitride layer 28 has a thickness of about 50 nm to about 300 nm. In certain embodiments of the present invention, the thickness of the silicon nitride layer 28 is about 100 nm.

Figure 8:
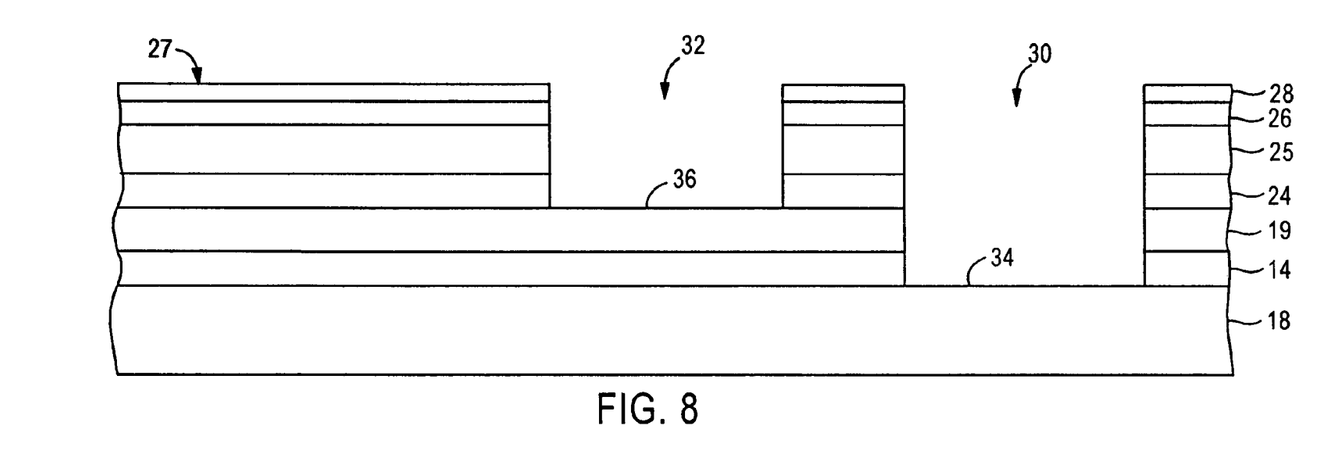

Openings 30, 32 are subsequently formed in the SOI structure 27, as illustrated in FIG. 8. In certain embodiments of the present invention, the openings 30, 32 are formed by conventional photolithographic and etching techniques to expose an upper surface 34 of the substrate 18 and an upper surface 36 of the first silicon layer 19. Conventional photolithographic and etching techniques include forming a resist layer over the SOI structure 27, masking and patterning the resist layer, and anisotropic etching of the SOI structure 27 to remove portions of the silicon nitride layer 28, silicon oxide layer 26, second silicon layer 25, and the second insulating layer 24 exposing the upper surface 36 of the first silicon layer 19. Etching is continued to remove portions of the first silicon layer 19 and first insulating layer 14 exposing the upper surface 34 of the substrate 12 in opening 30. The photoresist is subsequently stripped to provide the SOI structure 27 as shown in FIG. 8. Conventional anisotropic etching techniques include plasma etching and reactive ion etching. Anisotropic etching can alternately be carried out in a series of plasma etching steps using different known plasmas that optimally etch the various different layers. Because two openings 30, 32 of different depths are formed, separate photolithographic and etching steps can be used to form each opening 30, 32. Alternately, both openings can be formed simultaneously using gradient photolithographic techniques.

Figure 9:
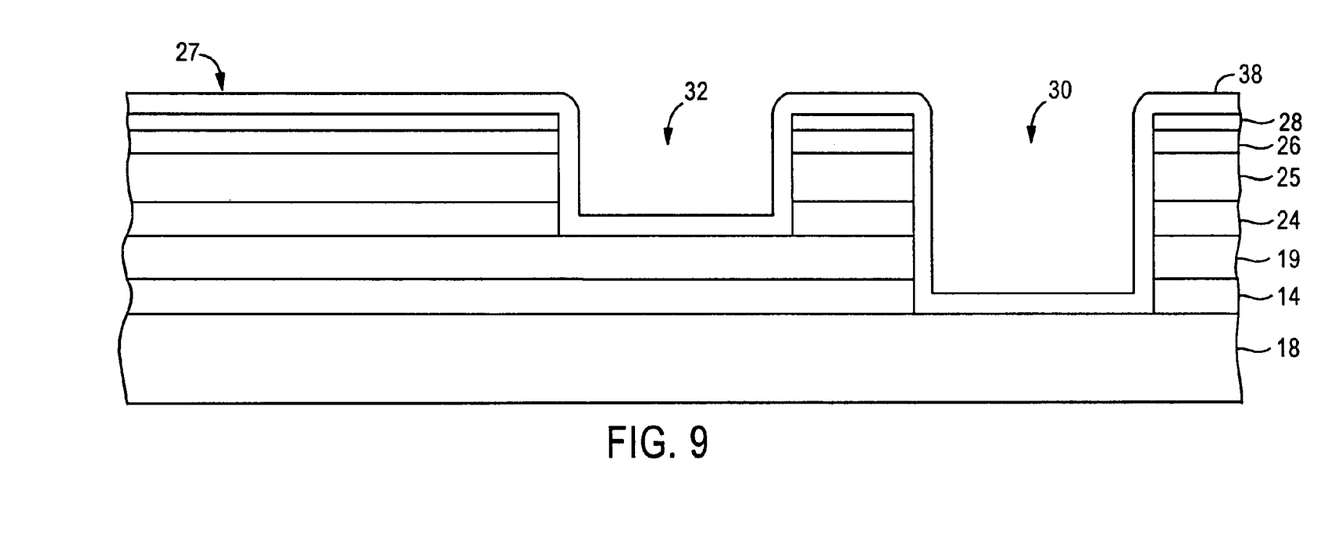
Figure 10:
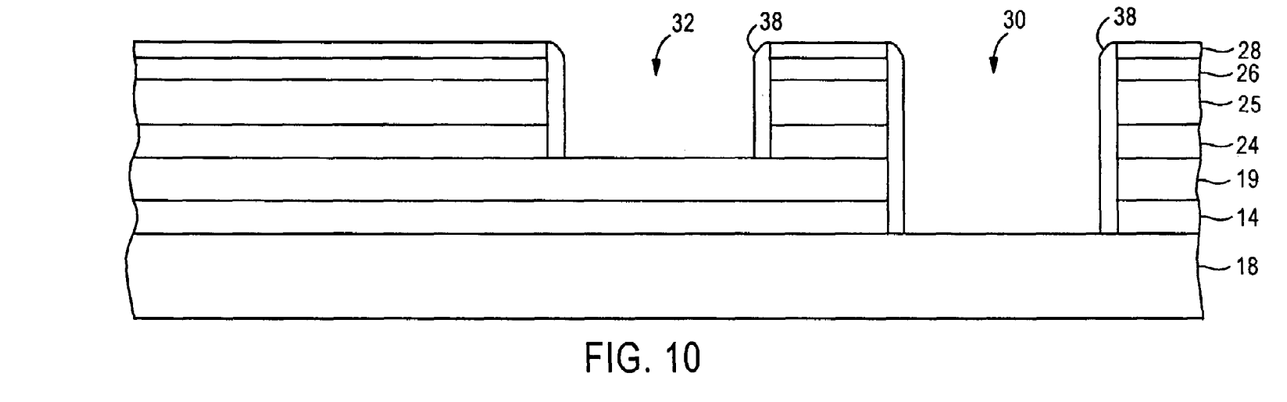

A second silicon nitride layer 38 is subsequently deposited over the SOI structure 27, as illustrated in FIG. 9. In certain embodiments of the present invention, the silicon nitride layer 38 is deposited to a thickness of from about 10 nm to about 100 nm by a conventional deposition technique, such as CVD. The silicon nitride layer 38 is subsequently anisotropically etched to form self-aligned sidewall spacers 38 in the openings 30, 32, as shown in FIG. 10. In certain embodiments of the present invention, the self-aligned spacers 38 can comprise other insulating materials. For example, self-aligned oxide spacers 38 can be formed by anisotropically etching a deposited a layer of silicon oxide.

Figure 11:
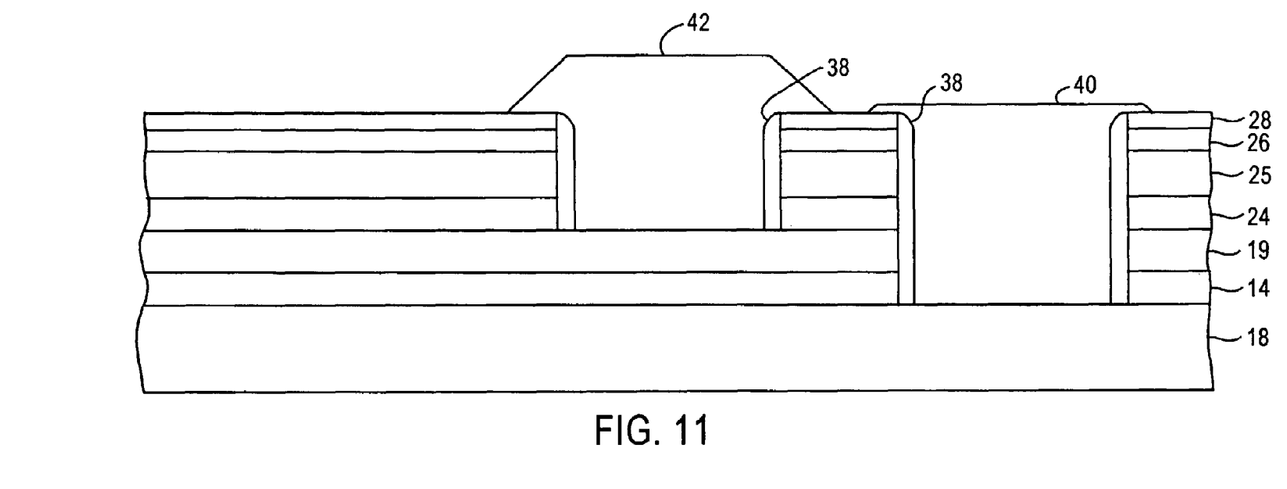

Selective epitaxial silicon layers 40, 42 are grown on the silicon substrate 18 and the first silicon layer 19, so that the epitaxial silicon layers 40, 42 extend over the tops of the respective openings 30, 32, as shown in FIG. 11. The epitaxial silicon layers 40, 42 have the same crystal orientation as their respective underlying base silicon layers 18, 19. Thus, epitaxial silicon layer 40 has the same crystal orientation as the silicon substrate 18 and epitaxial silicon layer 42 has the same crystal orientation as the first silicon layer 19.

Figure 12:
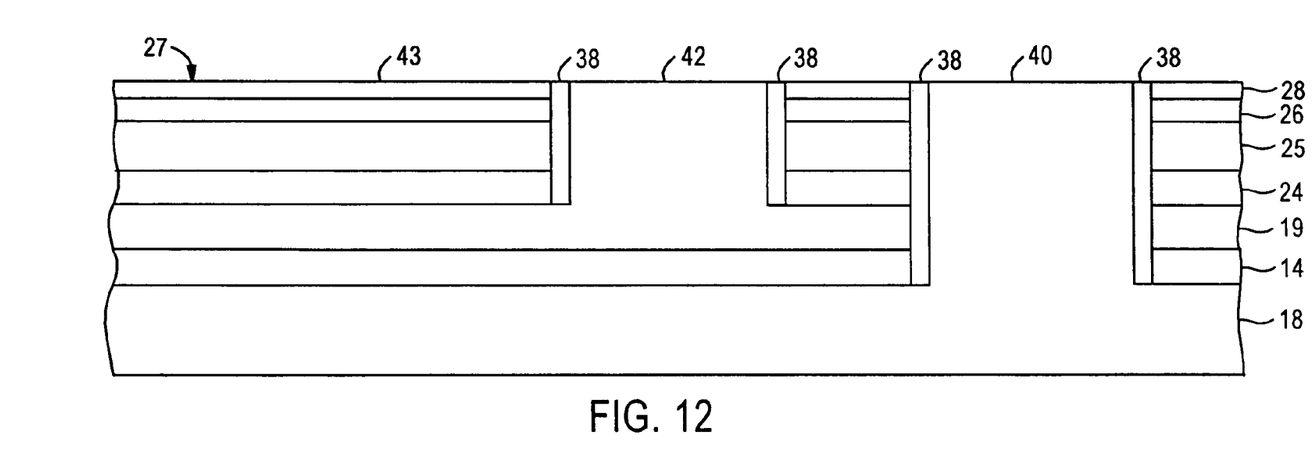

After the selective epitaxial silicon growth, conventional chemical-mechanical polishing (CMP) techniques are used to polish the epitaxial silicon layers 40, 42 so that they are substantially coplanar with an upper surface 43 of the second silicon nitride layer 28, as shown in FIG. 12.

Figure 13:
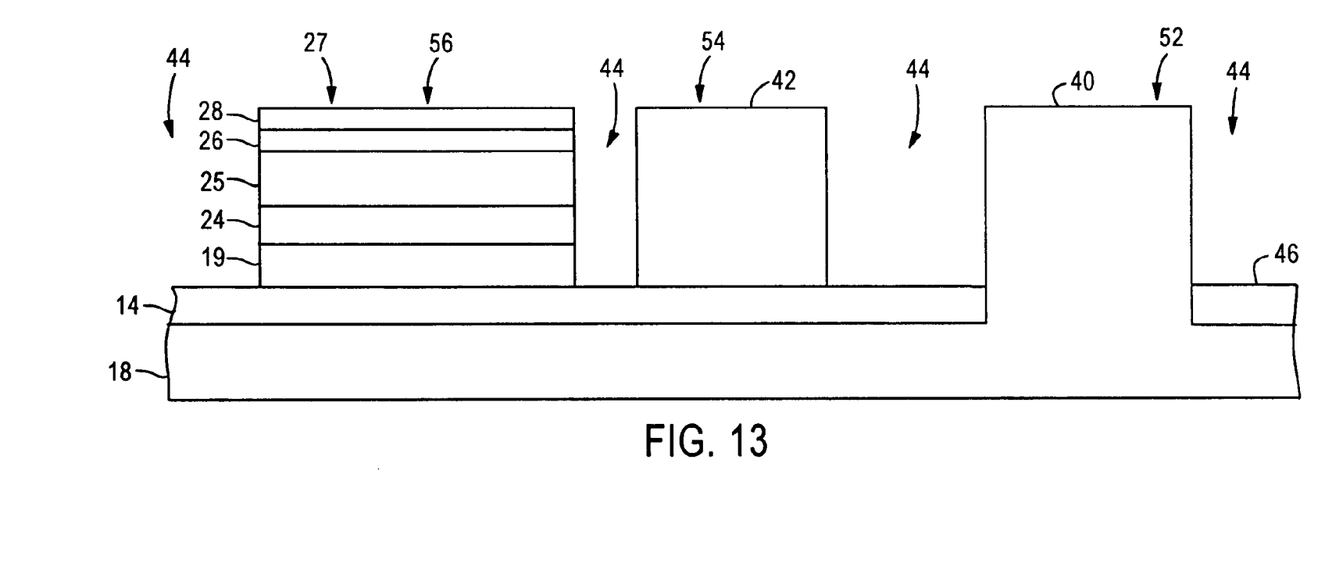

Three isolated regions, first region 52, second region 54, and third region 56, are formed in the SOI structure 27 and isolated from each other using conventional shallow trench isolation (STI) techniques. As shown in FIG. 13, trenches 44 are formed in the SOI structure 27 exposing the surface 46 of the first insulating layer 14. The trenches 44 are formed by conventional photolithographic and etching techniques, including depositing a photoresist on the SOI structure 27, selectively exposing and patterning the photoresist, anisotropic etching, and removal of the remaining photoresist to form trenches 44, as illustrated in FIG. 13. The trenches 44 are positioned around the nitride sidewalls 38, such that as the anisotropic etch is performed the nitride sidewalls 38 are removed from the structure 27.

Figure 14:
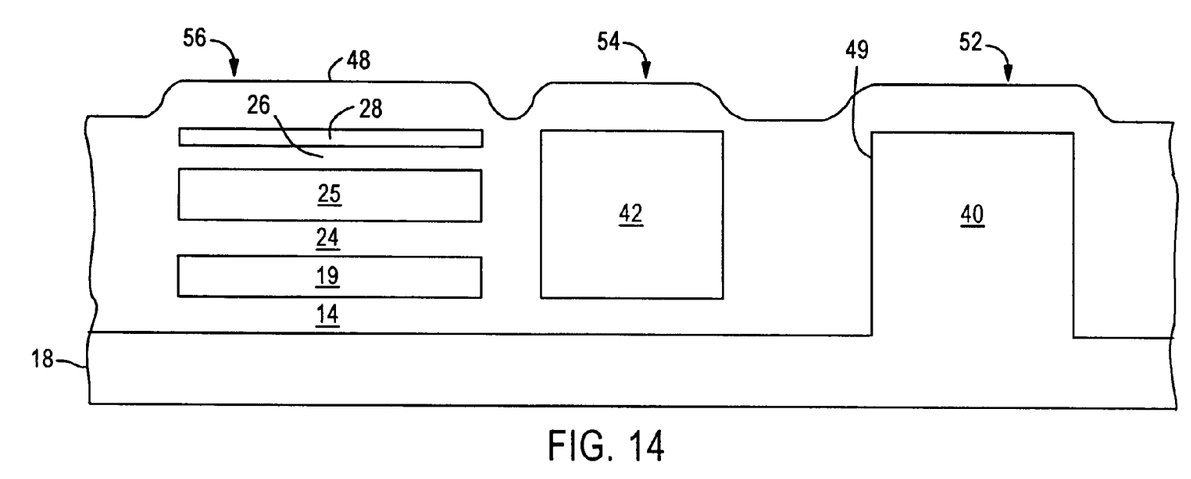

The trenches 44 are subsequently are filled with a suitable insulating material 48 as by a conventional CVD process as shown in FIG. 14. Suitable insulating materials 48 include silicon nitride and silicon oxide. In certain embodiments of the present invention, trench regions 44 are filled with silicon oxide 48 to isolate the first region 52, the second region 54, and the third region 56. Some of the conventional methods of filling trench region 44 with silicon oxide include:

(a) tetraethylorthosilicate low pressure chemical vapor deposition (TEOS LPCVD), (b) non-surface sensitive TEOS ozone atmospheric or sub-atmospheric pressure chemical vapor deposition (APCVD or SACVD), and (c) silane oxidation high-density plasma CVD.

Figure 15:
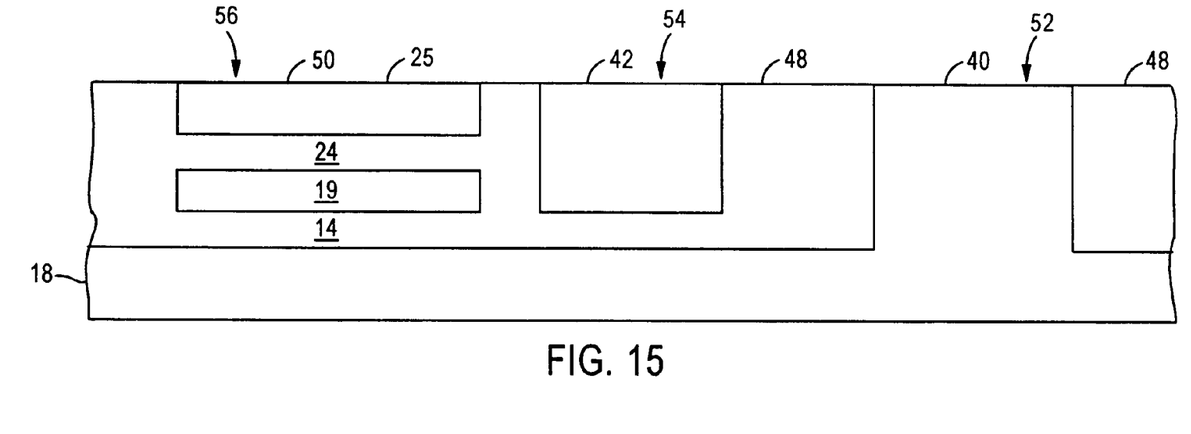

Prior to filling the trenches 44 with silicon oxide 48, thermal oxide liners (not shown) are conventionally grown along the walls 49 of the trenches 44, such as by exposing the structure 27 to an oxygen ambient at a temperature of approximately 950° C. to about 1100° C. The structure 27 is subsequently planarized by CMP to remove the silicon oxide 48 extending over the trenches 44. After planarizing, the silicon nitride layer 28 and silicon oxide layer 26 are subsequently removed, as shown in FIG. 15, exposing an upper surface 50 of the second silicon layer 25. The silicon nitride layer 28 and silicon oxide layer 26 are typically removed by wet etching. Hot phosphoric acid is conventionally used to etch silicon nitride and hydrofluoric acid or a mixture of hydrofluoric and ammonium fluoride (buffered oxide etch) is used to remove silicon oxide. In the resulting structure 27, the first silicon layer 42 in the second region 54 is isolated from the second silicon layer 25 in the third region 56 and a third silicon layer 40 in the first region 52. The third silicon layer 40 in the first region 52 is also isolated from the second silicon layer 25 in the third region 56.

Figure 16:
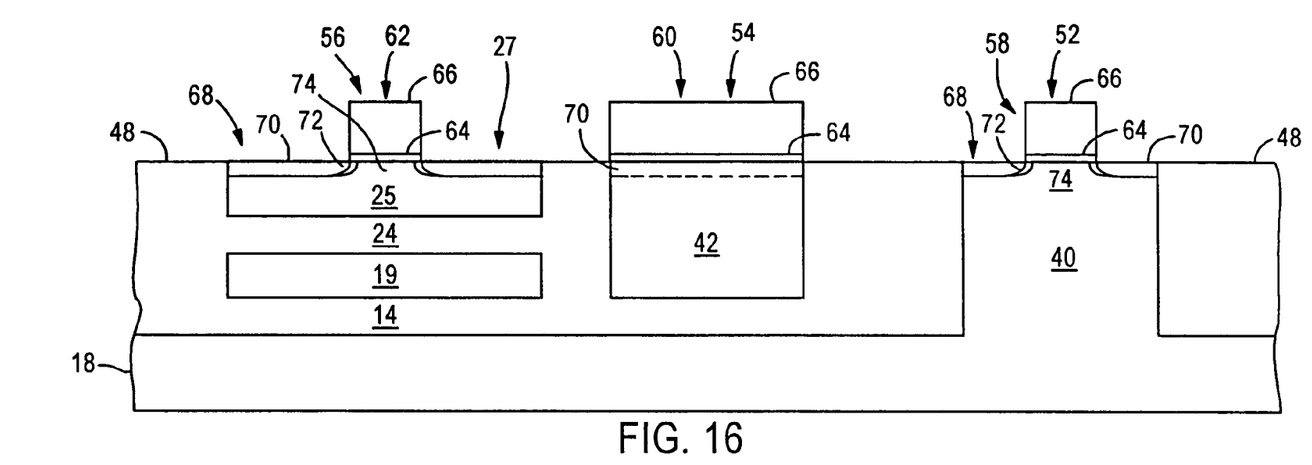

As illustrated in FIG. 16, a NMOSFET 58 is formed in the first region 52, a PMOSFET 60 is formed in the second region 54, and a PMOSFET 62 is formed in the third region 56 of the SOI structure 27. The PMOSFET 62 formed at the second silicon layer 25 in the third region 56 is oriented substantially orthogonal to the PMOSFET 60 formed at the first silicon layer 42 in the second region 54.

Gate oxide layer 64 and gate electrode layer 66 are formed over the structure 27. In certain embodiments of the present invention, the gate electrode layer 66 comprises polysilicon and is formed to a thickness of about 100 nm to about 300 nm. The gate oxide layer 64 is typically formed to thickness of about 10 Å to about 100 Å. The gate oxide layer 64 and gate electrode layer 66 are patterned by conventional photolithographic and etching techniques.

Source and drain extensions 70 are formed by conventional ion implantation techniques. The type of dopant implanted into the source and drain extensions 70 depends on whether the device is a NMOSFET or a PMOSFET. For example, if the transistor is a NMOSFET, N-type dopant is implanted into the source and drain extensions 70. In certain embodiments of the present invention, N-type dopant, such as arsenic, is implanted into the source and drain extensions 70 at an implantation dose of about $1 \times 10^{14}$ ions/cm$^2$ to about $2 \times 10^{15}$ ions/cm$^2$ and an implantation energy of about 1 keV to about 5 keV. If the transistor is a PMOSFET, P-type dopant is implanted into the source and drain extensions 70. In certain embodiments of the present invention, P-type dopant, such as boron difluoride (BF$_2$), is implanted into the source/drain extensions 70 at an implantation dose of about $1 \times 10^{14}$ ions/cm$^2$ to about $2 \times 10^{15}$ ions/cm$^2$ and an implantation energy of about 0.5 keV to about 5 keV Halo implants 72 are optionally formed in the channel regions 74, adjacent the source and drain regions 68 of the MOSFETs 58, 60, 62. The halo implants 72 are formed with a dopant of a conductivity type opposite that of the source and drain regions 68. The halo implants 72 can be formed by an angled implant in certain embodiments of the present invention. The halo implants 72, in certain embodiments of the present invention, can be implanted at a dose of about $8 \times 10^{12}$ ions/cm$^2$ to about $2 \times 10^{14}$ ions/cm$^2$ and an implantation energy of from about 7 keV to about 50 keV. Halo implants 72 prevent merger of the source and drain regions in the channel region 74. In addition, the threshold voltage of the MOSFETs 58, 60, 62 can be modified by adjusting the halo dose.

Figure 17:
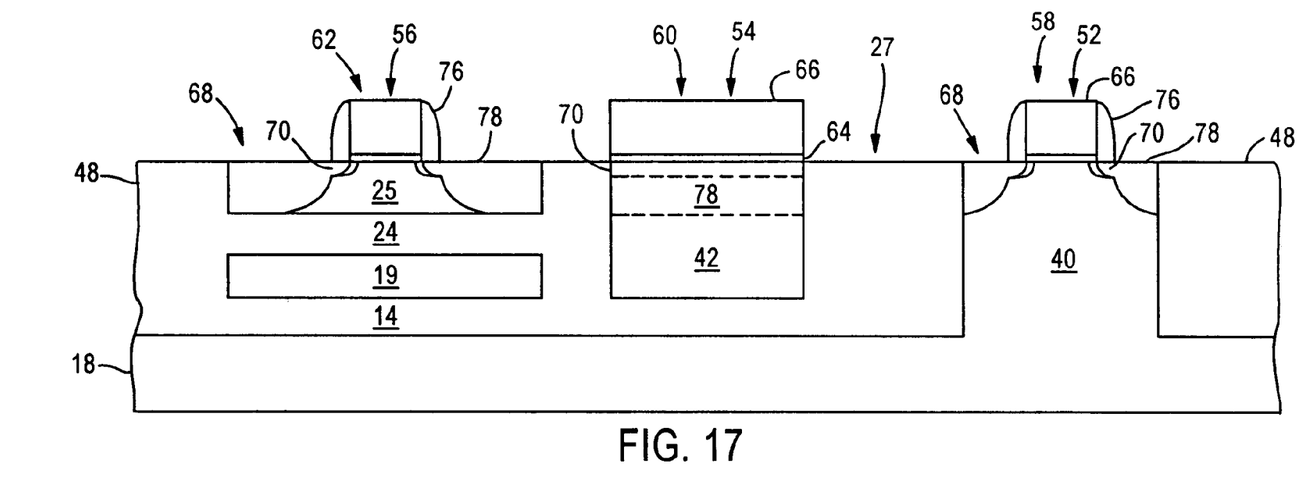

The heavily doped portions 78 of the source and drain regions 68 are subsequently formed. As shown in FIG. 17, sidewall spacers 76 are formed surrounding the gate electrodes 66 by conventional methods, such as the deposition of a layer of insulating material, such as silicon nitride or silicon oxide, followed by anisotropic etching to form the sidewall spacers 76. In certain embodiments of the present invention, if the transistor is a NMOSFET arsenic is implanted into the heavily doped regions 78 at an implantation dose of about $1 \times 10^{15}$ ions/cm$^2$ to about $4 \times 10^{15}$ ions/cm$^2$ and an implantation energy of about 20 keV to about 50 keV. If the transistor is a PMOSFET, boron is implanted into the heavily doped region 78 at an implantation dose of about $1 \times 10^{15}$ ions/cm$^2$ to about $4 \times 10^{15}$ ions/cm$^2$ and an implantation energy of about 2 keV to about 10 keV, in certain embodiments of the present invention.

Because PMOSFET performance can be greatly enhanced by fabricating PMOSFETs on silicon with a <110> crystal orientation, the silicon layer comprising <110> crystal orientation silicon is doped with a P-type dopant in the source and drain regions 68. The silicon layer comprising <100> crystal orientation silicon is doped with N-type dopant in the source and drain regions 68 to form a NMOSFET.

Figure 18:
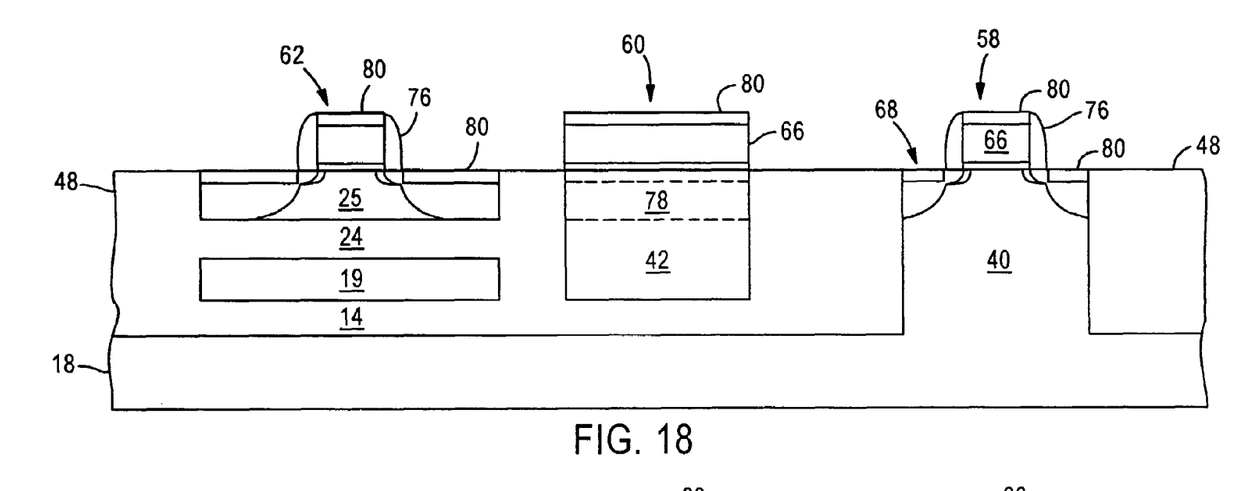

A metal layer is subsequently deposited over the SOI structure 27. The SOI structure 27 is heated to react the metal layer with underlying silicon in the source and drain regions 68 and gate electrodes 66 to form metal silicide contacts 80 in the source and drain regions 68 and on the gate electrodes 66, as shown in FIG. 18.

Figure 19:
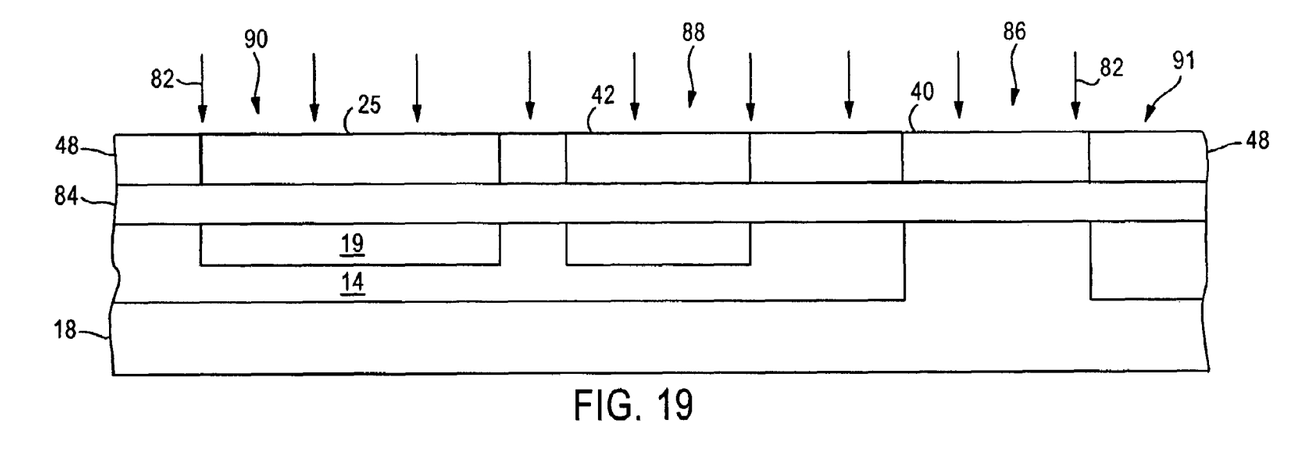
FIG. 19 illustrates the formation of buried oxide layer by the implantation of oxygen ion into a SOI structure.
Figure 20:
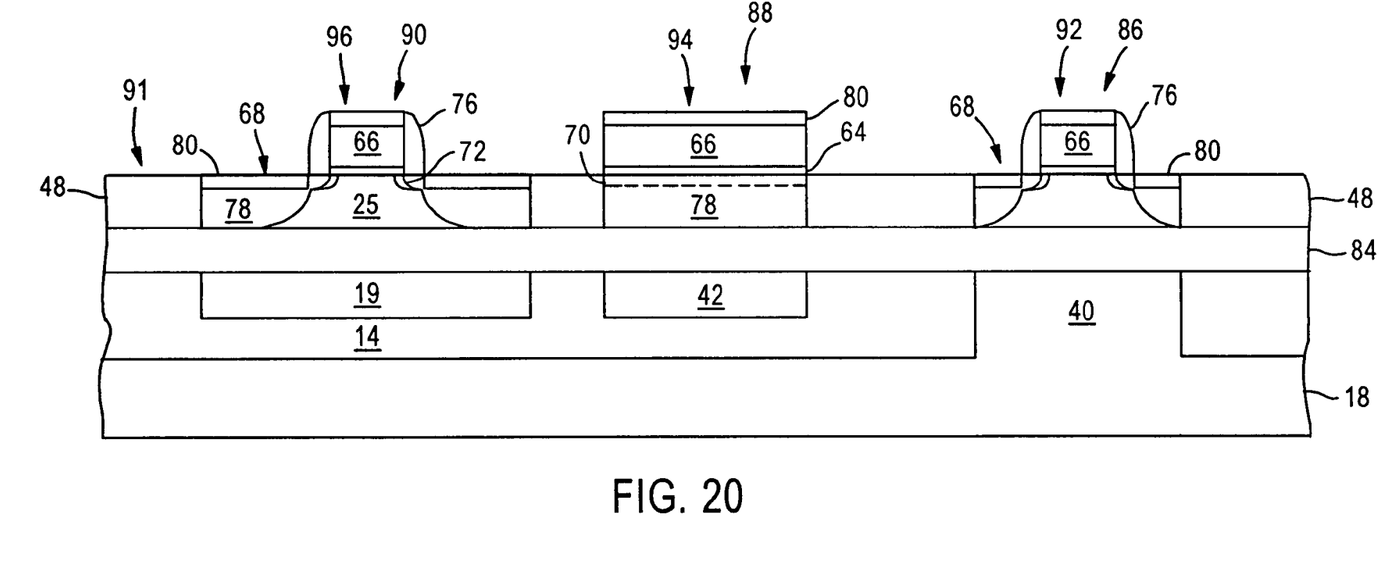
FIG. 20 illustrates an alternate embodiment of a SOI semiconductor device with MOSFETs formed on silicon layers of different crystal orientations on the same substrate.

In certain embodiments of the present invention, a SOI structure 91 is formed with an insulating BOX layer 84 so that the third silicon layer 40 in the first region 86, first silicon layer 42 in the second region 88, and the second silicon layer 25 in the third region 90 are each SOI silicon layers, as illustrated in FIG. 19. The BOX layer 84 is formed by a SIMOX process. In the SIMOX process, oxygen ions 82 are implanted into the SOI structure 91. In certain embodiments of the present invention, oxygen ions 82 are implanted into the SOI structure 91 at an energy in the range of from about 70 keV to about 200 keV and at a dose in the range from about $1.0 \times 10^{17}$ ions/cm$^2$ to about $1.0 \times 10^{18}$ ions/cm$^2$. After ion implantation, the SOI structure 91 is annealed at a temperature in the range of from about 1250° C. to about 1400° C. for about 4 to about 6 hours. As illustrated in FIG. 20, A plurality of MOSFETs 92, 94, 96 are subsequently formed in the first region 86, second region 88, and third region 90, as previously described.

In an alternate embodiment of the present invention, the BOX layer 84 does not extend under the third region 90. A hard oxide mask can be formed over the second region 90 using conventional deposition, photolithographic, and etching techniques, to protect the third region 90 from damage during the oxygen ion 82 implant in the first region 86 and the second region 88.

The embodiments of the present invention provide improved semiconductor devices that combine the performance improvements of SOI technology and optimum silicon crystal orientation. Semiconductor devices manufactured according to embodiments of the present invention feature increased hole mobility while maintaining high electron mobility. In addition, semiconductor devices according to embodiments of the present invention are configured so that high hole mobility is maintained in a plurality of PMOSFETs that are oriented substantially orthogonal to each other on a common plane of the device.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of forming a semiconductor device comprising:

providing a silicon-on-insulator structure comprising a first silicon substrate having a first crystal plane with a first insulating layer formed thereon and a first silicon layer having a second crystal plane and a crystal orientation overlying said first insulating layer;

providing a second silicon substrate having the second crystal plane and a crystal orientation and a second insulating layer formed on said second substrate, wherein said second silicon substrate comprises a line of defects created by implanting hydrogen ions into said second silicon substrate;

bonding said second silicon substrate to said silicon-on-insulator structure through said second insulating layer and said first silicon layer, such that the crystal orientation of the second silicon substrate is substantially orthogonal to the crystal orientation of the first silicon layer; and splitting and removing the second silicon substrate along the line of defects leaving behind the second insulating layer and a second silicon layer on the silicon-on-insulator structure.

2. A method of forming a semiconductor device comprising:

providing a silicon-on-insulator structure comprising a first silicon substrate having a first crystal plane with a first insulating layer formed thereon and a first silicon layer having a second plane and a second crystal orientation overlying said first insulating layer;

providing a second silicon substrate having the second crystal plane and a crystal orientation and a second insulating layer formed on said second substrate, wherein said second silicon substrate comprises a line of defects created by implanting hydrogen ions into said second silicon substrate;

bonding said second silicon substrate to said silicon-on-insulator structure through said second insulating layer and said first silicon layer, such that the crystal orientation of the second silicon substrate is substantially orthogonal to the crystal orientation of the first silicon layer;

splitting and removing the second silicon substrate along the line of defects leaving behind the second insulating layer and a second silicon layer on the silicon-on-insulator structure removing a portion of the second silicon layer, second insulating layer, first silicon layer, and first insulating layer to form an opening in a first region of the silicon-on-insulator structure exposing a portion of the first silicon substrate; and removing a portion of the second silicon layer and second insulating layer in a second region of the silicon-on-insulator structure exposing a portion of the first silicon layer.

3. The method of forming a semiconductor device according to claim 2, further comprising forming sidewall spacers on sidewalls of the first and second openings.

4. The method of forming a semiconductor device according to claim 3, further comprising growing epitaxial silicon in the first and second openings to provide a silicon-on-insulator structure with a third silicon layer having the first crystal plane in the first region of the silicon-on-insulator structure, first silicon layer having the second crystal plane and a crystal orientation in the second region of the silicon-on-insulator structure, and the second silicon layer having the second crystal plane and a crystal orientation substantially orthogonal to the crystal plane of the first silicon layer in a third region of the silicon-on-insulator structure.

5. The method of forming a semiconductor device according to claim 4, further comprising forming a plurality of insulating regions in said silicon-on-insulator structure to insulate said first region from said second and third regions, and to insulate said second region from said third region.

6. The method of forming a semiconductor device according to claim 5, wherein said step of forming said plurality of insulating regions comprises removing said sidewall spacers.

7. The method of forming a semiconductor device according to claim 5, further comprising forming a buried oxide layer in said first region of the silicon-on-insulator structure to insulate said third silicon layer from said substrate.

8. The method of forming a semiconductor device according to claim 7, further comprising forming said buried oxide layer in said second region of the silicon-on-insulator structure.

9. The method of forming a semiconductor device according to claim 7, further comprising forming a MOSFET in the first, second, and third regions of the silicon-on-isulator structure.

10. The method of forming a semiconductor device according to claim 5, wherein the third silicon layer has a (100) crystal plane and the first and second silicon layers have a (110) crystal plane.

11. The method of forming a semiconductor device according to claim 10, further comprising a forming a NMOSFET at the third silicon layer and forming PMOSFETs at the first and second silicon layers.

12. The method of forming a semiconductor device according to claim 4, wherein the deposited silicon layers are deposited by selective epitaxial deposition.

* * * * *